US008518814B2

(12) United States Patent
Stephens, IV et al.

(10) Patent No.: US 8,518,814 B2
(45) Date of Patent: Aug. 27, 2013

(54) METHODS OF FABRICATION OF HIGH-DENSITY LASER DIODE STACKS

(75) Inventors: Edward F. Stephens, IV, Golden Eagles, IL (US); Frank L. Struemph, Wentzville, MO (US); Jeremy Scott Junghans, St. Charles, MO (US)

(73) Assignee: Northrop Grumman Systems Corporation, Falls Church, VA (US)

( * ) Notice: Subject to any disclaimer, the term of this patent is extended or adjusted under 35 U.S.C. 154(b) by 61 days.

(21) Appl. No.: 13/310,432

(22) Filed: Dec. 2, 2011

(65) Prior Publication Data
US 2013/0143338 A1    Jun. 6, 2013

(51) Int. Cl.
*H01L 21/44* (2006.01)
(52) U.S. Cl.
USPC .......... 438/612; 257/E21.509; 369/13.32
(58) Field of Classification Search
USPC .......... 438/612; 369/13.32; 257/E21.509
See application file for complete search history.

(56) References Cited

U.S. PATENT DOCUMENTS

| 4,380,862 | A | 4/1983 | Nyul | |
|---|---|---|---|---|
| 4,454,602 | A | 6/1984 | Smith | 372/36 |
| 4,716,568 | A | 12/1987 | Scifres et al. | 372/36 |
| 5,084,886 | A | 1/1992 | Martin | 372/36 |
| 5,099,488 | A | 3/1992 | Ahrabi et al. | 372/36 |
| 5,325,384 | A | 6/1994 | Herb et al. | 372/36 |
| 5,394,426 | A | 2/1995 | Joslin | 372/50 |
| 5,818,859 | A | 10/1998 | Miller et al. | 372/45 |
| 5,898,211 | A | 4/1999 | Marshall et al. | 257/601 |
| 5,913,108 | A | 6/1999 | Stephens et al. | 438/109 |
| 5,978,396 | A | 11/1999 | Duchemin et al. | 372/43.01 |
| 5,985,684 | A | 11/1999 | Marshall et al. | 438/26 |
| 6,272,164 | B1 | 8/2001 | McMinn et al. | 372/50.12 |
| 6,310,900 | B1 | 10/2001 | Stephens et al. | 372/36 |
| 6,351,481 | B1 | 2/2002 | Marcomber | |
| 6,636,538 | B1 | 10/2003 | Stephens | 372/36 |

(Continued)

FOREIGN PATENT DOCUMENTS

EP    1215779    6/2002

OTHER PUBLICATIONS

P.A. Crump, et al. "High efficiency, high power 808-nm laser array and stacked arrays optimized for elevated temperature operation." 12 pages, 2004. Proceeding of SPIE vol. 5336 (SPIE, Bellingham, WA). Can be found at http://lib.semi.ac.cn:8080/tsh/dzzy/wsqk/SPIE/vol5336/5336-144.pdf.

(Continued)

*Primary Examiner* — William D Coleman
(74) *Attorney, Agent, or Firm* — Nixon Peabody LLP

(57) ABSTRACT

A method of fabricating a high-density laser diode stack is disclosed. The laser diode bars each have an emitter surface and opposing surfaces on either side of the emitter surface. Each laser diode bar has metallization layers on the opposing surfaces and a solder layer on at least one of the metallization layers. The solder layer is applied to a semiconductor wafer prior to cleaving the wafer to create the laser diode bars. The laser diode bars are arranged in a stack such that the emitter surfaces of the bars are facing the same direction. The stack of laser diode bars is placed in a vacuum chamber. An anti-reflection coating is deposited on the emitter surfaces of the laser diode bars in the chamber. The laser diode bars are joined by applying a temperature sufficient to reflow the solder layers in the chamber.

20 Claims, 5 Drawing Sheets

(56) References Cited

U.S. PATENT DOCUMENTS

| | | | |
|---|---|---|---|
| 6,700,913 B2 | 3/2004 | Pinneo et al. ............... 372/43 |
| 7,060,515 B2 | 6/2006 | Stephens ..................... 438/25 |
| 7,305,016 B2 | 12/2007 | Stephens ..................... 372/35 |
| 7,361,978 B2 | 4/2008 | Stephens ..................... 257/675 |
| 7,656,915 B2 | 2/2010 | Coleman et al. ............ 372/35 |
| 7,724,791 B2 | 5/2010 | Stephens, IV ............... 372/36 |
| 7,801,190 B2 * | 9/2010 | Lorenzen et al. ........... 372/36 |
| 7,860,136 B2 | 12/2010 | Stephens, IV et al. ..... 372/38.09 |
| 7,864,825 B2 | 1/2011 | Thiagarajan et al. ........ 372/36 |
| 2007/0116077 A1 | 5/2007 | Farmer et al. ............... 372/50 |
| 2008/0089371 A1 | 4/2008 | Reichert |
| 2009/0251697 A1 | 10/2009 | Cutillas et al. .............. 356/400 |
| 2010/0183039 A1 | 7/2010 | Schleuning |
| 2011/0051758 A1 | 3/2011 | Krejci et al. ................. 372/34 |
| 2012/0099407 A1 * | 4/2012 | Hipwell et al. ............ 369/13.32 |

OTHER PUBLICATIONS

Ryan Feeler, et al. "High-density pulsed laser diode arrays for SSL pumping," Proceedings of Spie, vol. 7686, 23 Apr. 2010, pp. 76860M-, XP55050411, ISSN: 0277-786X, DOI: 10.1117/12.850540.

Ryan Feeling, et al. "Low-cost diode arrays for the Life project," Proceedings of SPIE, vol. 7916, Feb. 10, 2011, pp. 791608-1-791607, XP55050020, ISSN: 0277-786X, DOI: 10.1117/12.873861.

Written Opinion of the International Searching Authority for International Patent Application PCT/US2012/064930, Mailed on Feb. 1, 2013, 12 pages.

International Search Report for International Patent Application No. PCT/US2012/064930, Mailed on Feb. 1, 2013, 6 pages.

* cited by examiner

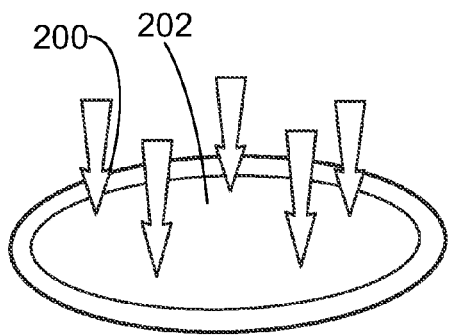
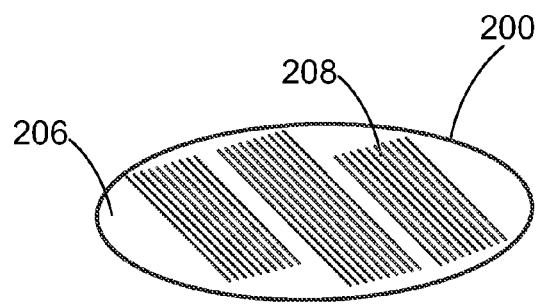
FIG. 2A       FIG. 2B
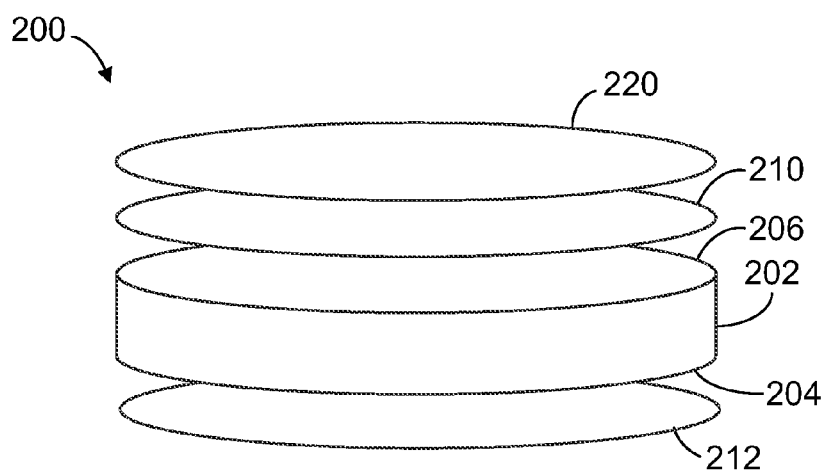
FIG. 2C

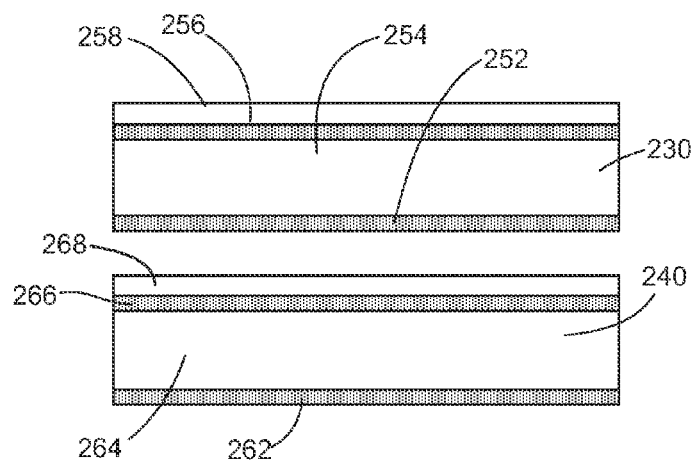
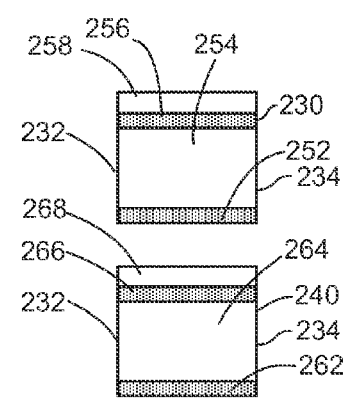
FIG. 3A  FIG. 3B
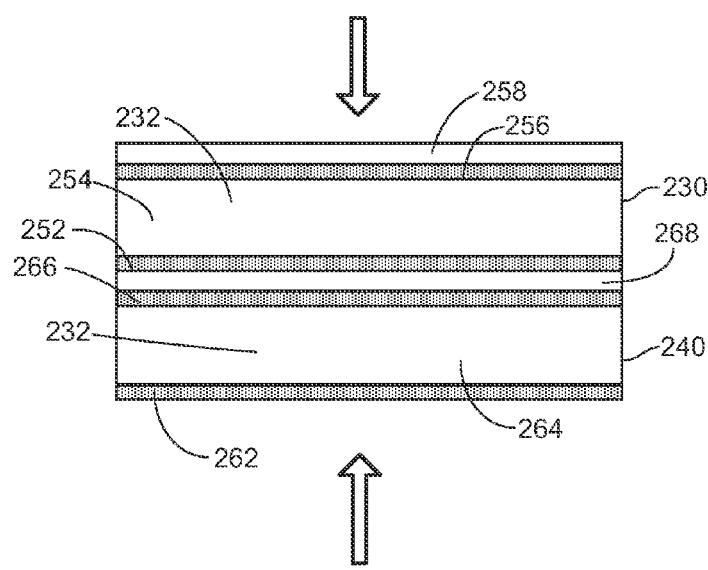
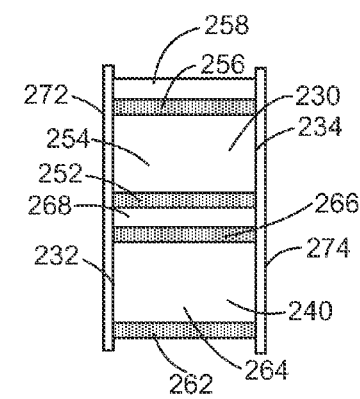
FIG. 4A  FIG. 4B

METHODS OF FABRICATION OF HIGH-DENSITY LASER DIODE STACKS

COPYRIGHT

A portion of the disclosure of this patent document contains material that is subject to copyright protection. The copyright owner has no objection to the facsimile reproduction by anyone of the patent disclosure, as it appears in the Patent and Trademark Office patent files or records, but otherwise reserves all copyright rights whatsoever.

TECHNICAL FIELD

The present disclosure relates generally to a method of fabricating a high-density laser diode system and specifically to a method for producing stacks of laser diode bars with application of solder prior to cleaving the bars from a wafer.

BACKGROUND

Semiconductor diode laser arrays are known in the art and are used in a variety of applications in the defense and aerospace fields. Two of the most common uses are illumination and solid-state laser (SSL) pumping, in which the radiation from the diode lasers is used to excite the laser crystal in order to generate light. The SSLs may then be used in a number of configurations and applications, including range finding and target designation. In many SSL applications it is common to operate the laser diode arrays in pulsed, or quasi-continuous wave (QCW) mode. In this mode, the diodes are electrically pumped with a pulse width that is commonly on the order of the upper state lifetime of the laser gain medium. For example, Nd:YAG lasers are typically pumped with pulse widths on the order of 200 μs. This pumping mode leads to efficient laser designs since most of the pump light that is absorbed by the laser crystal may be extracted from the system.

The repetition rate of the diode pumps is also defined by the application. Many range finding applications operate in the 10-30 Hz range, and many direct diode illuminations operate at around 60 Hz to match the frame rate on commercial off the shelf (COTS) camera systems. Quasi-continuous wave QCW diode pumping holds several advantages over CW diode pumping in SSL systems. First, QCW pumping creates a lower average thermal load in the laser gain medium. This simplifies the cooling of the system and also enables higher beam quality lasers due to the reduced thermal lensing effects. Second, QCW pumping allows the diodes to be operated at higher peak power than is possible with CW pumping. This leads to SSL systems with higher peak powers.

Such diode pumps are centered around a laser diode array of several laser diode bars. The laser diode bars are electrically connected together and aligned so that the light path from each of the individual semiconductor laser diode bars is parallel. Typically, laser diode bars are formed on a semiconductor material wafer that is cleaved into individual laser diode bars. The individual diode bars are then loaded into a fixture and high-reflection (HR) and anti-reflection (AR) coatings are deposited on opposing facets of the bars. Spacers are placed between each bar during loading to prevent coating spillover and to maintain the autonomy of each bar. Following facet coating, the bars are unloaded from the fixture, inspected, and placed into carriers until they are needed for packaging into a laser diode array assembly.

For example, a diode bar may be soldered to its own heatsink, which has a coefficient of thermal expansion (CTE) near that of the bar (e.g., ~6 ppm/K in the case of GaAs). This allows for the use of hard solders such as eutectic AuSn, which minimizes solder creep and promotes a high degree of reliability. The subassembly created when a bar and heatsink are joined is known as a Mounted Bar Assembly (MBA). A number of the MBAs are soldered together such that the associated heatsinks are attached to a ceramic backplane. This array is placed between electrical contacts to create the laser diode array. The electrical contacts also serve as large heatsinks on the end of the array. The bar-to-bar spacing, or pitch, is defined primarily by the thickness of the heatsink and any other spacing between the MBAs. For this type of array created by MBAs, pitch values ranging from 350 μm to 2 mm are fairly common in the industry today, but are much higher than the "brick" style of arrays described below. On the other hand, thermal efficiency in arrays created by MBAs is much better than the "brick" style of arrays described below.

In another packaging arrangement, a substrate (e.g. BeO) has a plurality of spaced apart and generally parallel grooves, each of which receives an individual laser diode bar. A soft solder layer is disposed in each of the grooves and the laser diode bars are soldered in the grooves. Electrical connection between the laser diode bars is accomplished by reflow of the solder layer within the grooves. However, such interconnections are not considered high density because of the wall thickness separating each groove and associated diode bar in the stack.

In many applications, including defense-related applications, it is often advantageous for the laser diode arrays to have a very high output power density. High diode output power densities enable the use of smaller laser crystals and also have a direct impact on the size, weight, and cooling requirements of the resulting laser system. For arrays built using the previously described process, featuring diode bars rated at 200-300 W/bar, the resulting power density is generally in the range of 5-8 kW/cm$^2$. There are several ways to increase the optical power density of a laser diode array. One way is to increase the output power of each of the diode bars that comprises the array. Additionally, optical methods (e.g., interleaving, beam combining) may be used to generate arrays with higher power densities.

Alternatively, the heatsinks or other heat-sinking components between the diode bars may be eliminated, which reduces the bar-to-bar pitch, thereby increasing the optical power density. This design is often referred to as a high-density stack. To build a high-density stack, the individual bars are then loaded into a separate fixture, with solder preforms placed between each bar. The stack of bars is then reflowed to create a "brick" of bars (e.g., 5-10 bars bonded together). In this process, a stack of laser diode bars are directly joined together (each bar bonded directly to adjacent bar) using a solder, such as an AuSn solder. This stack is then attached to a ceramic backplane and electrical contacts in a subsequent soldering step. The resulting array or brick of laser diodes has nominal bar-to-bar pitch of ~150 μm with pitches of less than 100 μm achievable. This pitch (150 μm) is approximately 40-50% of the smallest industry-standard pitch that may be obtained from other standard packaging methods, including those described above. This leads to optical power densities that are approximately two to three times higher than can be obtained using standard packaging methods.

While this technique produces a very high-density stack, it suffers from potentially damaging or chipping the dielectric anti-reflection and high reflection coatings that have already been applied to facets of each laser diode bar during assembly of the stack. The damage to one bar may result in the loss of the entire array in the production process.

Thus, there is a need for a high-density stack, semiconductor laser diode array that allows direct connection of the individual laser diode bars. There is a further need for a stacked diode array that is fabricated in such a manner to eliminate processing steps. There is also a need for a fabrication method to avoid known failure modes associated with fluxed soft-soldering interconnection methods while at the same time minimizing stress caused by packaging to prevent damage to the laser diode arrays during assembly. There is a further need for minimizing the oxidation of the laser diode bar substrate material when the bars are interconnected. There is also a need for a method of fabrication that minimizes the need for inspection of the bars after applying the anti-reflection and high reflection coatings.

SUMMARY

According to one example, a method of fabricating a stacked high-density laser diode array is disclosed. A plurality of laser diode dies is fabricated on a semiconductor wafer having opposite surfaces. A solder layer is applied on one of the surfaces of the wafer. The laser diode dies are cleaved into individual laser diode bars, each of the laser diode bars having a solder layer. A plurality of the individual laser diode bars are placed in a stack. Each of the individual laser diode bars in the stack is placed in contact with the solder layer of at least one adjacent individual bar. The plurality of individual laser diode bars are placed in a vacuum chamber. While in the vacuum chamber, the bars are attached together through a solder reflow process so as to form the laser diode array. Also while in the vacuum chamber, coatings (e.g., reflection coating and anti-reflection coatings) are applied to respective opposing facets of the laser diode bars.

Another example is a method of fabricating a high-density stack of laser diodes. Each of the laser diode bars has an emitter surface, opposing surfaces on either side of the emitter surface, a metallization layer on each of the opposing surfaces, and a solder layer on at least one of the metallization layers. The laser diode bars are arranged in a stack such that each of the laser diode bars are contacting at least one other laser diode bar and the emitter surfaces of the laser diode bars are facing the same direction. The stack of laser diode bars is placed in a vacuum environment. While in the vacuum environment, an anti-reflection coating is deposited on the emitter surfaces of the laser diode bars. While in the vacuum environment, the laser diode bars are joined by applying a temperature sufficient to reflow the solder layers.

Another example is a method of fabricating a high-density stack of laser diodes. Epitaxial layers are formed on a semiconductor wafer. The epitaxial layers include a quantum well. A first metallization layer is deposited on a first surface of the wafer. A second metallization layer is deposited on a second surface of the wafer opposite the first surface. A solder layer is applied on at least one of the first and second metallization layers of the wafer. After applying the solder layer, the wafer is cleaved into a plurality of laser diode bars. Each of the laser diode bars includes a surface having a bar solder layer that was a portion of the solder layer. Each of the plurality of laser diode bars has first and second cleaved facet surfaces substantially perpendicular to the surface having the bar solder layer. The plurality of laser diode bars is placed in a vacuum chamber such that the bar solder layers from the plurality of laser diode bars are placed against an adjacent laser diode bar and the first and second cleaved facet surfaces of the plurality of laser diode bars are exposed. An anti-reflection coating is formed on the first cleaved facet surface of the laser diode bars in a vacuum chamber. A high-reflection coating is formed on the second opposite cleaved facet surface of the laser diode bars in the vacuum chamber. The plurality of laser diode bars is exposed to a temperature sufficient to reflow the bar solder layers in the vacuum chamber.

Additional aspects of the invention will be apparent to those of ordinary skill in the art in view of the detailed description of various embodiments, which is made with reference to the drawings, a brief description of which is provided below.

BRIEF DESCRIPTION OF THE DRAWINGS

FIG. 2A is a perspective view of a wafer showing application of epitaxial layers in the substrate for producing the active regions of laser diode dies;

FIG. 2B is a perspective view of the wafer in FIG. 2A after channels have been formed for the active epitaxial layers of the laser diode dies;

FIG. 2C is an exploded schematic view of the wafer, the different metallization layers and a solder layer;

FIG. 3A is a top view of two laser diode bars cleaved from the wafer in FIGS. 2A-2C;

FIG. 3B is a side view of the two laser diode bars in FIG. 3A;

FIG. 4A is a top view of the arrangement of the two laser diode bars in FIG. 3A during the solder reflow and coating processes;

FIG. 4B is a side view of the arrangement of the two laser diode bars in FIG. 4A.

Figure 1A:
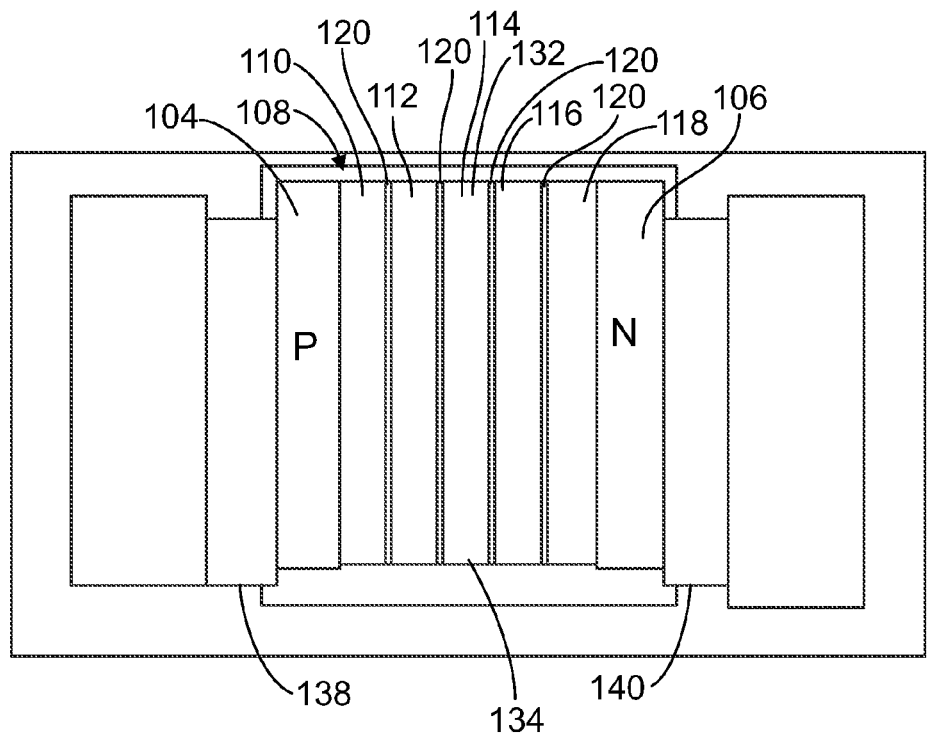
FIG. 1A is a perspective view of a high-density laser diode array device.

While the invention is susceptible to various modifications and alternative forms, specific embodiments have been shown by way of example in the drawings and will be described in detail herein. It should be understood, however, that the invention is not intended to be limited to the particular forms disclosed. Rather, the invention is to cover all modifications, equivalents, and alternatives falling within the spirit and scope of the invention as defined by the appended claims.

DETAILED DESCRIPTION

Figure 1B:
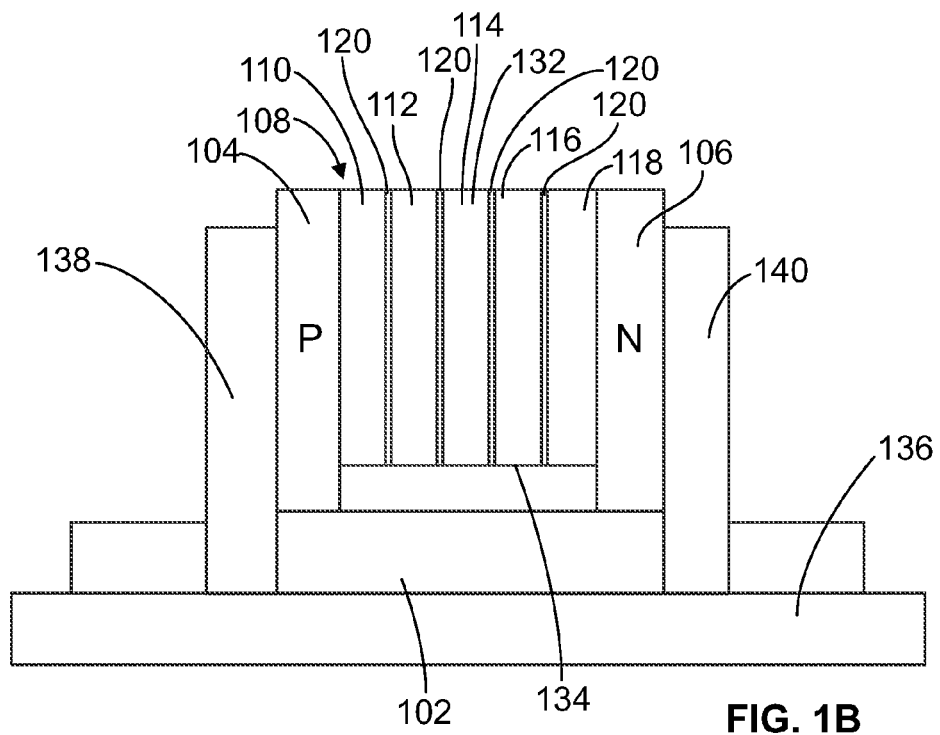
FIG. 1B is a side view of the high-density laser diode array device in FIG. 1A.

FIGS. 1A and 1B show a high-density stack laser diode array device 100 that may be used in a variety of laser applications. The high-density stack laser diode device 100 includes a backplane 102, a pair of conductive end blocks 104 and 106, and a laser diode array 108 interposed between the conductive end blocks 104 and 106. The laser diode array 108 includes a plurality of laser diode bars 110, 112, 114, 116, and 118. Since the plurality of laser diode bars 110, 112, 114, 116, and 118 are in direct contact with each other, the laser diode array 108 is a high-density stack. Although five laser diode bars are shown in this example, it is to be understood that other numbers of laser diode bars may be used in the high-density stack laser diode device 100. Layers of solder 120 electrically couple the laser diode bars 110, 112, 114, 116, and 118 to each other. Such laser diode bars 110, 112, 114, 116, and 118 are normally formed in a rectangular bar shape from various semiconductor materials such as GaAs, AlGaAs, and InP.

The solder layers 120 forming the mechanical and electrical connections between adjacent laser diode bars 110, 112, 114, 116, and 118 in the laser diode array 108 may be a non-fluxed solder, hard and/or soft, such as 80 Au/20 Sn, (Gold-Tin), Au/Ge (Gold-Germanium), Gold-Silicon Eutectic, Sn 96, or other soft eutectic solders. As will be explained below, the solder material of the solder layers 120 is melted at relatively low processing temperature such as between 200-225 degrees C. in a vacuum. This is also an appropriate environment for applying coatings on the laser diode bars.

Each of the laser diode bars 110, 112, 114, 116, and 118 in the laser diode array 108 has an emitting surface 132, which in FIG. 1A is emitting light energy out of the paper and in FIG. 1B emitting light energy upwardly. The emitting surface 132 includes an anti-reflection coating to emit the laser light. Each of the laser diode bars 110, 112, 114, 116, and 118 in the laser diode array 108 also has an opposite reflective surface 134. The reflective surface 134 includes a reflective coating to reflect the generated laser light from the semiconductor material in the laser diode bars 110, 112, 114, 116, and 118, such that energy is only emitted from the emitting surface 132. The length of the laser diodes bars 110, 112, 114, 116, and 118 between the opposite surfaces 132 and 134 is considered the cavity length.

In order to reduce the operating temperature of the laser diode array 108 generated by the laser diode bars 110, 112, 114, 116, and 118, the backplane 102 is rigidly secured to a thermally conductive dielectric substrate surface 136. The substrate 136 may be, for example, a beryllium oxide (BeO) substrate. Such BeO substrates are known to have a thermal conductivity of 200 watts/meter·Kelvin. Other substrate materials are also suitable, such as silicon carbide, which has a thermal conductivity of 270/280 watts/meter. Kelvin.

The conductive end blocks 104 and 106 on the opposing ends of the laser diode array 108 are attached to electrodes 138 and 140 for connection to an electrical circuit to power the laser diode bars 110, 112, 114, 116, and 118. The electrodes 138 and 140 in this example may be formed from Au-plated Cu covered with Kapton™ film and are generally formed in an L-shape. The electrodes 138 and 140 are normally formed on opposing longitudinal edges to allow the laser diode bars 110, 112, 114, 116, and 118 to be connected to an external source of electrical power. When such semiconductor laser diode bars are arranged in an array such as the laser diode array 108, the individual laser diode bars 110, 112, 114, 116, and 118 are connected in series between the conductive end blocks 104 and 106.

FIG. 2A-2C show perspective views of the processing of a semiconductor material wafer 200 used to form laser diode bars such as the laser diode bars 110, 112, 114, 116, and 118 in FIGS. 1A and 1B. The wafer 200 in this example is gallium arsenide (GaAs) but other suitable semiconductor materials such as AlGaAs, and InP may be used. FIG. 2A shows the wafer 200 (which is on the order of 625 microns microns before a wafer thinning process) while active epitaxial layers 202 are being formed on the GaAs substrate. FIG. 2B illustrates channel waveguides 208 are formed on a p-side 206 (FIG. 2C) that will serve to define the internal structure within the laser diode, as is known in the art.

FIG. 2C is a schematic view of the wafer 200 after the epitaxial growth process and a wafer-thinning thinning process. For purposes herein, the substrate in FIG. 2C (which is on the order of 125 microns in thickness after a wafer thinning process) and epitaxial layers (which are on the order of about 5 microns) will be collectively referred to as the substrate/epitaxial layers 202. The substrate/epitaxial layers 202 include an n-side 204. The substrate/epitaxial layers 202 also include a p-side 206 that is opposite the n-side 204 as shown in FIGS. 2B and 2C. As is known in fabrication of the active layers for producing laser diodes, the active epitaxial layers on the substrate include multiple layers of n-doped material, p-doped material, and undoped material. A quantum well is formed within these layers, and is the region at which photons will be produced in the laser diode bars 110, 112, 114, 116, and 118.

As shown in FIG. 2C, which is an exploded view of the various applied layers on the wafer 200, a metallization layer 210 is deposited on the p-side 206. The metallization layer 210 may be patterned to form the electrical contacts to the laser diode dies formed by the waveguides 208 of the p-side 206 of the substrate/expitaxial layers 202. The wafer 200 is thinned to approximately 125 microns in this example to form the opposite n-side 204. A metallization layer 212 is also deposited on the n-side 204 after the wafer 200 is thinned. The metallization layers 210 and 212 are approximately 3 microns in thickness. The metallization layers 210 and 212 may be titanium, titanium-tungsten, platinum and gold or other appropriate metals.

Unlike prior art methods, a layer of solder, which is eventually used to attach adjacent laser diode bars 110, 112, 114, 116, and 118, is applied before the bars are cleaved from the wafer 200. In this example, a layer of solder metal 220 is deposited onto the wafer 200 on the metallization layer 210 on the p-side 206. The layer of solder metal 220 is relatively thin and is applied on one of the opposing surfaces of the wafer 200 on the respective metallization layer.

Alternatively, the solder metal layer 220 could be patterned to cover only the laser diode die areas on the wafer 200 prior to cleaving. Such a method may be preferred since more metal used for the solder metal layer 220 increases the difficulty of cleaving the wafer 200. Such patterning also avoids hiding the alignment features used for the cleaving process.

Figure 2D:
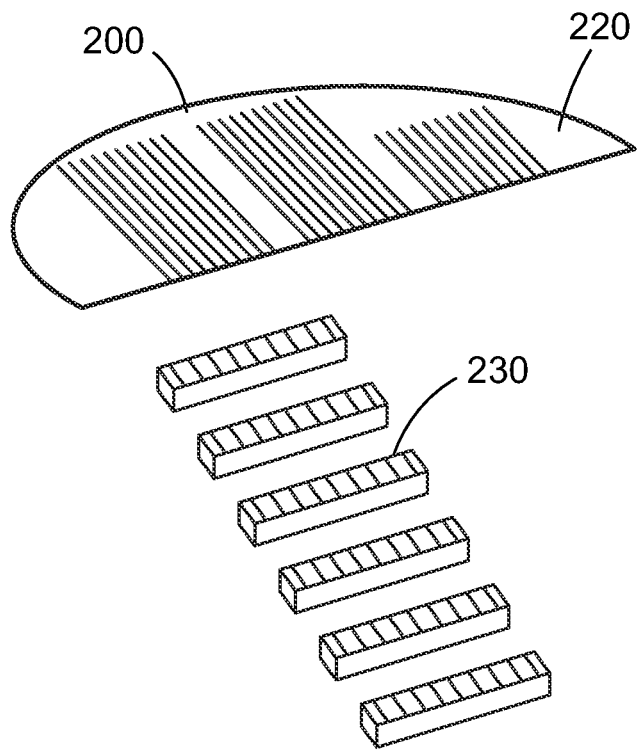
FIG. 2D is a perspective view of the wafer being cleaved into individual laser diode bars.

FIG. 2D shows a perspective view of the wafer 200 with the solder layer 220 on the p-side 206 during cleaving. In this example, the solder metal layer 220 is a few microns (e.g., 1-5 microns) thick, while the overall thickness of the wafer 200 (with metallization) is about 125-150 microns in thickness (as wafer thinning has already occurred). The wafer 200 is cleaved into separate laser diode bars 230 as shown in FIG. 2D and the resulting bars are typically inspected.

Figure 2E:
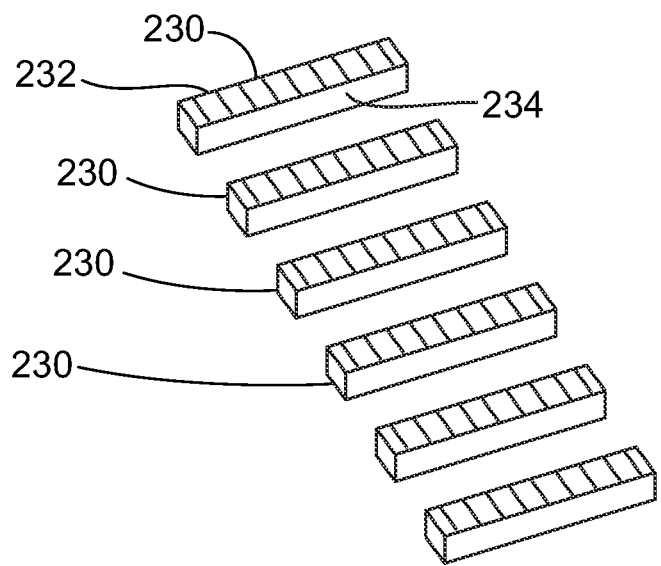
FIG. 2E is a perspective view of the resulting laser diode bars before they formed into a laser diode array.

FIG. 2E is a perspective view of laser diode bars 230 cleaved from the wafer 200 after the processing described in FIGS. 2A-2D. The laser diode bars 230 are cleaved to achieve a desired length and each bar 230 has a solder layer formed from a portion of the solder metal layer 220 on the metallization layer 210 contacting the p-side 206. Each cleaved laser diode bar 230 also includes two opposing cleaved facets 232 and 234 that are substantially perpendicular to the p-side 206 having the solder metal layer 220. The cleaved facets 232 and 234 define the cavity length of the laser diode bar 230.

FIGS. 3A and 3B are top and side views of the laser diode bar 230 in FIGS. 2D and 2E and a second laser diode bar 240 formed by the same process. The first laser diode bar 230 has a very thin n-side metallization layer 252, active substrate/epitaxial layers 254, a very thin p-side metallization layer 256, and a solder layer 258. The metallization layer 252 is formed on the n-side of the laser diode bar and is formed from a part of the metallization layer 212 in FIG. 2C. The active substrate/epitaxial layers 254 are formed from a part of the epitaxial layers 202 in FIG. 2C. The metallization layer 256 is formed on the p-side of the laser diode 230 and is formed from a part of the metallization layer 210 in FIG. 2C. The solder layer 258 is formed as a part of the solder layer 220 in FIG. 2C.

The second laser diode bar 240 has a very thin n-side metallization layer 262, active substrate/epitaxial layers 264, a very thin p-side metallization layer 266, and a solder layer 268. The metallization layer 262 is formed on the n-side of the laser diode bar and is formed from a part of the metallization layer 212 in FIG. 2C. The active substrate/epitaxial layers 264 are formed from a part of the epitaxial layers 202 in FIG. 2C. The metallization layer 266 is formed on the p-side of the laser diode 230 and is formed from a part of the metallization layer 210 in FIG. 2C. The solder layer 268 is formed as a part of the solder layer 220 in FIG. 2C.

An array of uncoated laser diode bars such as the laser diode bars 230 and 240 are then loaded into a coating fixture (e.g., a vise, which is not shown) and placed in a vacuum environment, such as a vacuum chamber to minimize oxidation. In this example, the vacuum chamber is pumped down to about $10^{-6}$ torr for the processing described below. Each bar is placed in direct contact with each other such as the bars 230 and 240 shown in FIG. 4A and FIG. 4B. FIG. 4A is a top view of the two laser diode bars 230 and 240 from FIGS. 3A-3B. The two laser diode bars 230 and 240 are arranged in the coating fixture so the solder layer 268 formed on a p-side metallization layer 266 of the laser diode bar 240 contacts the metallization layer 252 of the other laser diode bar 230. FIG. 4B is a side view of the two laser diode bars 230 and 240 in contact with each other with the exposed surfaces of the cleaved facets 232 and 234. As may be seen, the laser diode bars 230 and 240 are also arranged so their respective facets 232 face one direction and the other facets 234 face the opposing direction. The facets 232 and 234 of the bars 230 and 240 will form the reflective surfaces and the emitter surfaces.

The vacuum chamber is heated so a high reflection (HR) coating layer 272 and an anti-reflection (AR) coating layer 274 may be deposited onto the facet surfaces of the opposing cleaved facets 232 and 234, respectively, of the laser diode bars 230 and 240 (rather than coating the individual bars before they are assembled) in the stack of laser diode bars. In this example, the anti-reflection coating layer 274 is first deposited on the cleaved facet 234 and then the high reflection coating layer 272 is deposited on the cleaved facet 232. Of course, the high reflection coating layer 272 may be deposited prior to the deposition of the anti-reflection coating 274 if desired. Both of the coating layers 272 and 274 are applied at temperatures less than 225 C in this example. Both coating layers 272 and 274 are about the thickness of the wavelength of the laser emission from the bars. As explained above, the high reflection coating layer 272 (e.g., greater than 99% reflectance) reflects the energy generated by the semiconductor material in the laser diode bars 230 and 240. The opposite anti-reflection coating layer 274 is less reflective (e.g. a 3% to 7% reflectance), allowing light to be emitted out of the laser diode bars 230 and 240. The anti-reflection coating layer 274 and high reflection coating layer 272 are also applied to prevent oxidizing the substrate material of the laser diode bars 230 and 240, which can be damaging Alternatively, the vacuum chamber can be heated to a point allowing the solder reflow, and then the coatings can be placed on the cleaved facets 232 and 234.

The vise (or similar device) is used to apply compressive force (shown by the arrows in FIG. 4A) to press the laser diode bars 230 and 240 together. The vacuum chamber containing the coating fixture is heated to the reflow temperature of the solder layers 258 and 268 in order to applying the coating layers 272 and 274. When the reflow occurs, the solder layer and the adjacent metallization layers intermix to some extent such that the solder alloy itself becomes a slightly different composition, especially adjacent to the metallization layers. For example, if the solder layer is 80% Au/20% Sn and the metallization layer includes gold, the solder alloy may change to an 85% Au/15% Sn mix near the metallization layer due to the migration of some of the gold metallization layer into the reflowing solder. The pressure and temperature function to melt the solder layer 268 between the bars 230 and 240 and mechanically and electrically join the laser diode bars 230 and 240 together.

The relatively thin solder metal layer 220 minimizes the gushing of the solder metal to the coatings of the active areas of the laser diode bars when the laser diode bars are heated and compressive pressure is applied by the vise. As explained above, the solder metal layer 220 is preferably deposited on the metallization layer 210 on the p-side 206 of the laser diode bars cleaved from the wafer 200 shown in FIGS. 2A-2C. Alternatively, the solder metal layer 220 could be deposited on the metallization layer 212 on the n-side 204, instead of the metallization layer 210. Also, a second layer of solder may also be deposited on the opposite surface of the wafer 200 such as the metallization layer 212 on the n-side 204 if the first solder layer is deposited on the p-side 206 of the wafer 200. The application of a second layer of solder may be desirable to provide thorough wetting of the solder and improve adhesion during the reflow process, but involves an additional processing step. Since the coating layers 272 and 274 in FIG. 3 are deposited and the solder metal layer 220 is melted at high temperatures in the vacuum environment the oxidation of the semiconductor materials in the laser diode bars due to the higher temperatures is minimized.

Once the coating layers 272 and 274 are applied and the solder layer 268 is melted to join the bars 230 and 240, the laser diode bars such as the laser diode bars 230 and 240 form coated and bonded "bricks" of laser diode bars such as the laser diode bars 110, 112, 114, 116, and 118 in the laser diode array 108 in FIG. 1. The bonded bricks of laser diode bars may then be combined or bonded to a backplane such as the backplane 102 in FIG. 1 and electrical contacts such as the electrodes 138 and 140 may be assembled without the additional stacking and reflow steps that were previously required for high-density stack laser diode arrays.

Figure 5:
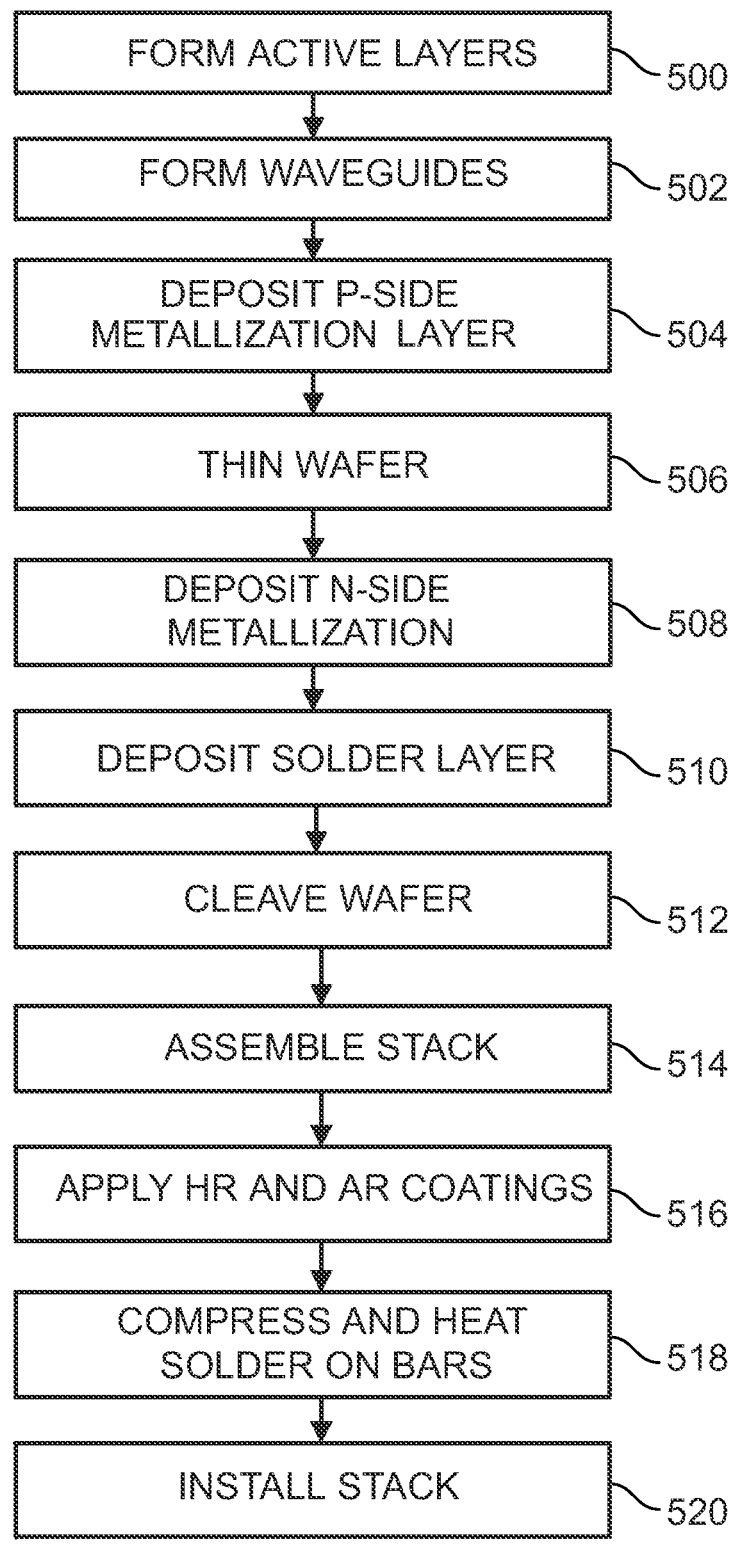
FIG. 5 is a flow diagram of the process of applying solder to a wafer prior to cleaving and the process of producing a high-density stack laser diode array.

FIG. 5 shows a flow diagram of the process described above with reference to FIGS. 1 and 2. The wafer 200 in FIG. 2A is first processed by controlled formation of semiconductor layers on the substrate such as the active epitaxial layers 202 (500). As explained above, the wafer 200 in FIGS. 2A-2B is a GaAs substrate in this example. Forming the epitaxial layers 202 includes the growth and processing of the n-doped layers, the p-doped layers, undoped layers as is known in the art. The channel waveguides 208 of the laser diode dies on the wafer 200 may be formed through photolithography and selective etching as shown in FIG. 2B (502). The metallization layer 210 is then deposited on the p-side 206 of the wafer 200 (504). The wafer 200 may then be thinned to a desired thickness (506). The metallization layer 212 is then applied to the n-side 204 of the wafer 200 (508). The layer of solder metal 220 is deposited on the metallization layer 210 of the p-side 206 of the wafer 200 (510) as shown in FIG. 2C.

The individual bars are then scribed and the wafer 200 is cleaved into the laser diode bars 230 as shown in FIG. 2D (512). The cleaving forms cleaved facet surfaces 232 and 234 as shown in FIG. 2E that are substantially parallel to the surface with the layer of solder metal 220. The resulting laser diode bars are then assembled into a stack and placed in a coating fixture in a vacuum chamber (514). The high reflection coating layer 272 and the anti-reflection coating layer 274 are applied to the cleaved facets 232 and 234 of the laser diode bars in the stack as shown in FIG. 3 (416). The stack of laser diode bars is heated to a temperature sufficient to reflow the solder metal layer 220 and pressure is applied (e.g., via a vise) to solder the laser diode bars together (518). The solder metal therefore electrically connects each of the laser diode bars in the brick. The bonded brick of laser diode bars is then connected to electrical contacts such as the conductive end blocks 104 and 106 and fixed on the backplane 102 in FIG. 1 to form a high-density stack laser diode device (520).

The above mentioned process of applying the solder metal layer to the wafer prior to cleaving and applying the reflection and anti-reflection coatings in the same environment that the bars are joined has a number of advantages. The number of processing steps (stacking and reflow) is decreased since solder does not have to be applied to the individual diode bars. Compared to current HR and AR coating methods where groups of bars (without solder) are closely stacked to avoid the coatings reaching the side metallization layers, the possibility of facet damage to the bars in the present invention is reduced during assembly since the bars do not need to pulled apart after coating, which can cause damage to the coating edges. The inspection of individual laser diode bars following the coating process is streamlined to inspecting the entire brick of bars as opposed to pulling the cleaved bars apart after the coating process. The heating of the bars and the application of coatings in a vacuum environment minimizes the oxidation of the substrate material.

By referring to laser diode bars, it should be understood that a laser diode bar includes a commonly available laser diode bar, which is about 1 cm in length and has multiple emitters (e.g., 20 to 100 emitters along the ~1 cm length). Additionally, the present invention also covers laser diode bars having smaller lengths (e.g., 0.3 mm in length and two or three emitters), bars having larger lengths, and bars with only a single emitter.

Each of these embodiments and obvious variations thereof is contemplated as falling within the spirit and scope of the claimed invention, which is set forth in the following claims.

What is claimed is:

1. A method of fabricating a stacked high-density laser diode array, the method comprising:
   fabricating a plurality of laser diode dies on a semiconductor wafer having opposite surfaces;
   applying a solder layer on one of the surfaces of the wafer;
   cleaving the laser diode dies into individual laser diode bars, each of the laser diode bars having a solder layer;
   placing a plurality of the individual laser diode bars in a stack, wherein each of the individual laser diode bars are in contact with the solder layer of at least one adjacent individual bar;
   placing the plurality of individual laser diode bars in a vacuum chamber; and
   while in the vacuum chamber, (i) attaching the bars together through a solder reflow process so as to form the laser diode array, and (ii) applying a reflection coating and an anti-reflection coating to respective opposing facets of the laser diode bars.

2. The method of claim 1, wherein the stack of individual laser diode bars forms a laser diode array having opposing ends, the method further comprising:
   bonding the opposing ends of the laser diode array to conductor end blocks;
   seating the conductor end blocks to a first surface of a backplane; and
   connecting a second surface of the backplane to a heat-conducting substrate, the second surface of the backplane being opposite the first surface of the backplane.

3. The method of claim 1, wherein the solder layer is one of a group of 80 Au/20 Sn, Au/Ge, Gold-Silicon eutectic, Sn 96, or other soft eutectic solders.

4. The method of claim 1, wherein the solder layer is patterned to correspond to the plurality of laser diode dies on the wafer.

5. The method of claim 1, wherein the solder layer is applied over the entire surface of the wafer.

6. The method of claim 1, wherein the solder reflow process occurs in the vacuum chamber prior to the applying of the reflection coating and the anti-reflection coating.

7. The method of claim 1, wherein the applying of at least one of the reflection and anti-reflection coatings occurs prior to the solder reflow process.

8. A method of fabricating a high-density stack of laser diodes, each of the laser diode bars having an emitter surface, opposing surfaces on either side of the emitter surface, a metallization layer on each of the opposing surfaces, and a solder layer on at least one of the metallization layers, the method comprising:
   arranging the laser diode bars in a stack such that each of the laser diode bars are contacting at least one other laser diode bar and the emitter surfaces of the laser diode bars are facing the same direction;
   placing the stack of laser diode bars in a vacuum environment;
   while in the vacuum environment, depositing an anti-reflection coating on the emitter surfaces of the laser diode bars; and
   while in the vacuum environment, joining the laser diode bars by applying a temperature sufficient to reflow the solder layers.

9. The method of claim 8, wherein each of the laser diode bars has a reflective surface opposite the emitter surface and wherein a high-reflection coating is deposited on the reflective surface while in the vacuum environment.

10. The method of claim 9, wherein the anti-reflection coating is deposited prior to depositing the high-reflection coating and joining the laser diode bars.

11. The method of claim 9, wherein the joining the laser diode bars occurs prior to depositing the anti-reflection coating and the high-reflection coating.

12. The method of claim 9, wherein the laser diode bars are cleaved from a semiconductor wafer having active layers including a p-doped layers and n-doped layers, the metallization layers including a first metallization layer and a second metallization layer, and wherein the first metallization layer is deposited on a p-side of the wafer, the wafer being thinned to form a second opposite surface and wherein the second metallization layer is deposited on second opposite surface.

13. The method of claim 12, wherein a solder layer is applied to the first metallization layer prior to cleaving the wafer to form the laser diode bars, the solder layer forming the solder layer on at least one of the metallization layers of the laser diode bars.

14. The method of claim 13, wherein a second solder layer is applied to the second metallization layer, and wherein each of the laser diode bars has a second solder layer formed from the second solder layer applied to the second metallization layer.

15. A method of fabricating a high-density stack of laser diodes, comprising:

forming epitaxial layers on a semiconductor wafer, the epitaxial layers including a quantum well;

depositing a first metallization layer on a first surface of the wafer;

depositing a second metallization layer on a second surface of the wafer opposite the first surface;

applying a solder layer on at least one of the first and second metallization layers of the wafer;

after applying the solder layer, cleaving the wafer into a plurality of laser diode bars, each of the laser diode bars including a surface having a bar-solder layer that was a portion of the solder layer, each of the plurality of laser diode bars having first and second cleaved facet surfaces substantially perpendicular to the surface having the bar-solder layer;

placing the plurality of laser diode bars in a vacuum chamber such that (i) the bar-solder layers from the plurality of laser diode bars are placed against an adjacent laser diode bar and (ii) the first and second cleaved facet surfaces of the plurality of laser diode bars are exposed;

forming an anti-reflection coating on the first cleaved facet surface of the laser diode bars in a vacuum chamber;

forming a high-reflection coating on the second opposite cleaved facet surface of the laser diode bars in the vacuum chamber; and exposing the plurality of laser diode bars to a temperature sufficient to reflow the bar-solder layers in the vacuum chamber.

16. The method of claim 15, wherein the plurality of laser diode bars is exposed to the temperature prior to forming the high reflection and anti-reflection coatings.

17. The method of claim 15, wherein the anti-reflection coating is formed prior to the plurality of laser diode bars being exposed to the temperature sufficient to reflow the bar solder layers.

18. The method of claim 17, wherein the high-reflection coating is formed after the anti-reflection coating is formed and prior to the plurality of laser diode bars being exposed to the temperature sufficient to reflow the bar-solder layers.

19. The method of claim 15, wherein the bar solder layers are one of a group of 80 Au/20 Sn, Au/Ge, Gold-Silicon eutectic, Sn 96, or other soft eutectic solders.

20. The method of claim 17, further comprising applying a second solder layer on the other one of the first or second metallization layers of the wafer.

* * * * *